(12) United States Patent
Kim et al.

(10) Patent No.: US 12,176,238 B1
(45) Date of Patent: Dec. 24, 2024

(54) CRYOGENIC SUSCEPTOR AND ELECTRIC CONNECTOR ASSEMBLY USED THEREIN

(71) Applicant: MICO CERAMICS LTD., Anseong-si (KR)

(72) Inventors: Hyekyong Kim, Anseong-si (KR); Minho Ji, Anseong-si (KR)

(73) Assignee: MICO CERAMICS LTD., Anseong-si (KR)

( * ) Notice: Subject to any disclaimer, the term of this patent is extended or adjusted under 35 U.S.C. 154(b) by 0 days.

(21) Appl. No.: 18/715,018

(22) PCT Filed: Dec. 8, 2021

(86) PCT No.: PCT/KR2021/018530
§ 371 (c)(1),
(2) Date: May 30, 2024

(87) PCT Pub. No.: WO2023/106445
PCT Pub. Date: Jun. 15, 2023

(30) Foreign Application Priority Data

Dec. 8, 2021 (KR) .......................... 10-2021-0174628

(51) Int. Cl.
*H01T 23/00* (2006.01)
*H01L 21/683* (2006.01)
(52) U.S. Cl.
CPC ................ *H01L 21/6833* (2013.01)
(58) Field of Classification Search
None
See application file for complete search history.

(56) References Cited

U.S. PATENT DOCUMENTS

| 7,491,432 | B2* | 2/2009 | Kachi | .................... | H05B 3/143 |
| | | | | | 428/34.4 |
| 2009/0277895 | A1 | 11/2009 | Komatsu et al. | | |
| 2011/0063771 | A1 | 3/2011 | Nishioka | | |
| 2012/0250211 | A1 | 10/2012 | Kida et al. | | |

(Continued)

FOREIGN PATENT DOCUMENTS

| JP | 2001237304 A | 8/2001 |
| JP | 2002141404 A | 5/2002 |

(Continued)

OTHER PUBLICATIONS

Non-Final Office Action of KIPO for Korean Application No. 10-2021-0174628, issued on Jan. 28, 2022.

(Continued)

*Primary Examiner* — Stephen W Jackson
(74) *Attorney, Agent, or Firm* — NKL Law; Byungwoong Park

(57) ABSTRACT

Disclosed is a susceptor which can operate with durability, even at a low or cryogenic temperature. The present invention provides a susceptor characterized by comprising: a base member; a ceramic plate having electrodes on the base member; and an electrode connector assembly for applying power to the electrodes of the ceramic plate through the base member. The electrode connector assembly comprises: a first connector terminal which is the end in contact with the electrodes; a second connector terminal which is the end where power is input; and a connector rod connecting the first connector terminal and the second connector terminal.

14 Claims, 4 Drawing Sheets

(56) References Cited

U.S. PATENT DOCUMENTS

| | | |
|---|---|---|
| 2013/0220545 A1 | 8/2013 | Koizumi et al. |
| 2014/0204501 A1 | 7/2014 | Moriya et al. |
| 2015/0340261 A1 | 11/2015 | Katayama et al. |
| 2021/0327741 A1 | 10/2021 | Nagayama et al. |
| 2022/0108909 A1* | 4/2022 | Tamura ............... H01L 21/6833 |
| 2022/0238316 A1* | 7/2022 | Lee ................... H01L 21/67109 |
| 2024/0038509 A1* | 2/2024 | Bae ................... H01L 21/68792 |
| 2024/0203782 A1* | 6/2024 | Ji ...................... H01L 21/68785 |

FOREIGN PATENT DOCUMENTS

| | | |
|---|---|---|
| JP | 2008135737 A | 6/2008 |
| JP | 2011086919 A | 4/2011 |
| JP | 2014138164 A | 7/2014 |
| JP | 2015088745 A | 5/2015 |
| JP | 2016143795 A | 8/2016 |
| JP | 2020047638 A | 3/2020 |
| KR | 100979915 B1 | 9/2010 |
| KR | 1020110099974 A | 9/2011 |
| KR | 101071441 B1 | 10/2011 |
| KR | 20120112036 A | 10/2012 |
| KR | 20150135071 A | 12/2015 |
| KR | 20200031356 A | 3/2020 |

OTHER PUBLICATIONS

Final Office Action of KIPO for Korean Application No. 10-2021-0174628, issued on Jun. 20, 2022.
Notice of Allowance Action of KIPO for Korean application No. 10-2021-0174628, issued on Sep. 29, 2022.
International Search Report of PCT/KR2021/018530, issued Aug. 30, 2022.

* cited by examiner

CRYOGENIC SUSCEPTOR AND ELECTRIC CONNECTOR ASSEMBLY USED THEREIN

TECHNICAL FIELD

The present disclosure relates to a susceptor and, more specifically, to a susceptor that is capable of operating durably even at a temperature of about −100° C. or lower.

BACKGROUND ART

Semiconductor devices or display devices are manufactured by laminating and patterning multiple thin film layers including dielectric layers and metal layers on a glass substrate, a flexible substrate, or a semiconductor wafer substrate through semiconductor processes such as a chemical vapor deposition (CVD) process, a physical vapor deposition (PVD) process, an ion implantation process, and an etching process. A chamber apparatus for performing these semiconductor processes is provided with a susceptor such as an electrostatic chuck (ESC) to support various substrates, such as a glass substrate, a flexible substrate, and a semiconductor wafer substrate, and to fix a corresponding substrate, in particular, by using an electrostatic force.

This susceptor is usually used to support a substrate at room temperature or high temperature. However, recently, there has been a growing need to perform a film forming process or an substrate to a cryogenic etching process while cooling a temperature of −50° C. or lower or −100° C. or lower.

In particular, as the difficulty in an etching process required for manufacturing semiconductor devices with a line width of 10 nm or less, 3D NAND flash devices, or the like increases due to the increase in semiconductor stacking height and decrease in circuit line width for ultra-fine semiconductor manufacturing, process issues such as a microbridge (a defect where a line width is reduced and portions that should not be etched are connected to each other) and a polymer bottleneck phenomenon (a phenomenon in which an entrance to a circuit becomes narrowed due to polymer) occurs frequently. To solve these process issues, cryogenic etching processes are being developed in which selectivity is improved and uniform etching is enabled even when an etching depth increases by lowering the temperature inside the chamber to −100° C. to minimize the movement of gases required for etching without polymers.

In the case of conventional susceptors, however, use at such a cryogenic temperature is not considered, and there is a need for the design of susceptors suitable for use at a cryogenic temperature.

Summary In order to solve the problems of the prior art, the present disclosure is to provide a structure of an electrode connector assembly suitable for a susceptor for a low temperature or cryogenic temperature.

In addition, the present disclosure designs the materials of components of an electrode connector assembly of a susceptor for a low temperature or cryogenic temperature.

In addition, the present disclosure is to provide an electrode connector assembly for a susceptor that is capable of being stably driven while suppressing material deterioration or brittle fracture due to deformation, shrinkage stress, or the like even when driven in a low-temperature or cryogenic environment.

In addition, the present disclosure provides an electrode connector assembly structure of a susceptor that operates stably without thermal deformation or condensation in a low-temperature or cryogenic environment.

Furthermore, the present disclosure is to provide a susceptor including the above-described electrode connector assembly.

In view of the foregoing, the present disclosure provides a susceptor including: a base member; a ceramic plate including an electrode on the base member; and an electrode connector assembly provided through the base member and configured to apply power to the electrode of the ceramic plate. The electrode connector assembly includes: a first connector terminal which is a contact end with the electrode; a second connector terminal which is a power inlet end; and a connector rod interconnecting the first connector terminal and the second connector terminal.

In the present disclosure, the first connector terminal may include a protrusion on a surface facing the electrode. In this case, the protrusion of the first connector terminal may have an engraved pattern. In addition, the engraved pattern may be a cross pattern, a straight line pattern, or a grid pattern.

In addition, the susceptor of the present disclosure may further include a conductive elastomer filled between the first connector terminal and the electrode, and the first connector terminal and the electrode may be electrically connected to each other by the conductive elastomer. In this case, the conductive elastomer preferably contains conductive powder dispersed therein. In case, the conductive powder may be metal powder or carbon powder.

In the present disclosure, the electrode connector assembly may include an insulating tube surrounding the first connector terminal, the connector rod, and the second connector terminal. In addition, an insulating elastomer may be filled between the first connector terminal and the second connector terminal.

In the present disclosure, the connector rod may be implemented with a soft metal.

In addition, the connector rod may be implemented by twisting or weaving a plurality of metal wires.

In addition, the present disclosure provides a susceptor including: a base member; a ceramic plate including an electrode on the base member; and an electrode connector assembly provided through the base member and configured to apply power to the electrode of the ceramic plate. The electrode connector assembly may include a conductive elastomer between the electrode and a first connector terminal as a contact end with the electrode, and is electrically connected to the electrode via the conductive elastomer.

In the present disclosure, the conductive elastomer contains conductive powder dispersed in at least one polymer selected from the group consisting of silicone rubber, butadiene, a copolymer of styrene and acrylonitrile, butyl rubber, and fluorine rubber.

In addition, in the present disclosure, the first connector terminal may be made of titanium or a titanium alloy.

According to the present disclosure, it is possible to provide an electrode connector assembly for a susceptor that is capable of being stably driven while suppressing material deterioration or brittle fracture due to deformation, shrinkage stress, or the like even when driven in a low-temperature or cryogenic environment of −50° C. or lower, and a susceptor including the electrode connector assembly.

In addition, according to the present disclosure, it is possible to provide an electrode connector assembly for a susceptor that operates stably without thermal deformation or condensation in a low-temperature or cryogenic environment, and a susceptor including the electrode connector assembly.

Figure 1:
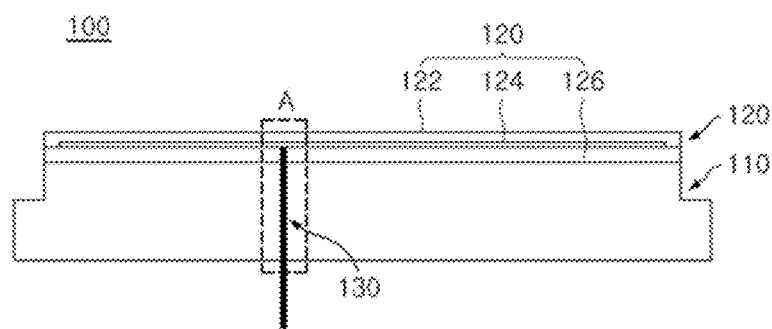
FIG. 1 a view illustrating the structure of a susceptor according to an embodiment of the present disclosure.

Detailed Description of Exemplary Embodiments Hereinafter, the present disclosure will be described in detail with reference to the accompanying drawings. Herein, like components in each drawing are denoted by like reference numerals if possible. In addition, detailed descriptions of already known functions and/or configurations will be omitted. In the following description, components necessary for understanding operations according to various embodiments will be mainly described, and descriptions of elements that may obscure the gist of the description will be omitted. In addition, some elements in the drawings may be exaggerated, omitted, or schematically illustrated. The size of each component does not the actual size.

Therefore, the descriptions provided herein are not limited by the relative sizes or spacings of the components drawn in each drawing.

In describing the embodiments of the present disclosure, when a detailed description of the known technology related to the present disclosure is determined to be unnecessarily obscure the subject matter of the present disclosure, the detailed description will be omitted. In addition, terms to be described later are defined in consideration of functions in the present disclosure, and may vary according to the intention, custom, or the like of a user or operator. Therefore, the definitions of the terms should be made based on the description throughout this specification. Terms used in the detailed description are only for describing the embodiments of the present disclosure, and should in no way be limiting. Unless expressly used otherwise, singular forms of expressions include the meanings of plural forms of expressions. In this expressions "including" or description, such as "comprising" are intended to indicate any features, numbers, steps, operations, elements, or some or combinations thereof, and should not be construed to exclude the existence or possibility of one or more other features, numbers, steps, operations, elements, or some or combinations thereof, in addition to those described above.

In addition, terms such as "first" and "second" may be used to describe various components, but the components are not limited by the terms, and these terms are only used for the purpose of distinguishing one component from another.

FIG. 1 is a view illustrating the structure of a susceptor 100 according to an embodiment of the present disclosure.

Referring to FIG. 1, the susceptor 100 according to an embodiment of the present disclosure includes a base member 110 and a ceramic plate 120. The susceptor 100 is preferably of a circular type, but in some cases, may be designed in another shape such as oval or square.

The base member 110 may be configured as a multi-layer structure including a plurality of metal layers. These metal layers may be bonded through a brazing process, a welding process, a bonding process, or the like. The ceramic plate 120 is fixed on the base member 110. For this purpose, predetermined fixing means or bonding means may be used. The base member 110 and the ceramic plate 120 may be manufactured separately and bonded to each other. However, in some cases, it is also possible to fabricate the structure of the ceramic plate 120 directly on the top surface of the base member 110.

In the susceptor 100 of the present disclosure, in order to uniformly cool a substrate (e.g., a glass substrate, a flexible substrate, or a semiconductor wafer) on the ceramic plate 120, the base member 110 and the ceramic plate 120 may include cooling structures (not illustrated) such as cooling gas holes and/or cooling gas flow paths.

In the present disclosure, the ceramic plate 120 includes at least one electrode 124. For example, the electrode 124 may be either a chucking electrode or an RF electrode. The electrode 120 as the chucking electrode may be a single monopolar electrode or may be configured as multiple electrodes driven in a bipolar manner. In addition, in the present disclosure, the electrode 124 as an RF electrode may be configured as a single electrode or multiple electrodes.

In addition, in the present disclosure, the plate 120 may include both the chucking electrode and the RF electrode. When the susceptor includes multiple electrodes, the electrodes may be present on the same plane or on different planes inside the ceramic plate.

As illustrated, the electrode 124 may be buried within the ceramic plate 120 or exposed on the surface of the ceramic plate. When the electrode is buried in the plate, the ceramic plate 120 may have a stacked structure of an insulating layer 126, an electrode 124, and a dielectric layer 122. Of course, the above-described three-layer stacked structure is an example, and the ceramic plate 120 may have a stacked structure with three or more layers.

In the present disclosure, the insulating layer 126 insulates the base member 110 and the electrode 124 from each other. The insulating layer 126 may be made of a ceramic material. For example, the insulating layer 126 may be made of at least one of aluminum oxide ($Al_2O_3$), aluminum nitride (AlN), silicon carbide (SiC), and silicon nitride ($Si_3N_4$) or may be made of a composite of these materials. In addition, the insulating layer 126 may be formed on the top surface of the base member 110 through thermal spray coating.

The electrode 124 may be made of a conductive metal material. As an example, the electrode 124 may be made of tungsten (W), molybdenum (Mo), or an alloy thereof. The electrode 124 may be fabricated through a thermal spray coating process or a screen printing process.

In the present disclosure, the dielectric layer 122 may be made of a ceramic material. In an embodiment, the dielectric layer 122 may be made of the same or different material from above-described insulating layer 126. For example, the dielectric layer 122 may be made of one selected from the group consisting of aluminum oxide ($Al_2O_3$), silicon oxide ($SiO_2$), barium oxide (BaO), zinc oxide (ZnO), cobalt oxide (CoO), tin oxide ($SnO_2$), and zirconium oxide ($ZrO_2$), or a composite of two or more of the above-mentioned material. In the present disclosure, the dielectric layer 122 may be formed by performing a thermal spray coating process on the top surfaces of the insulating layer 126 and the electrode 124.

An electrode connector assembly 130 is mounted on the electrode 124 inside the plate. The electrode connector assembly 130 is connected to external power supply (not illustrated) and applies power to the electrode 124 of the plate 120 through the base member 110.

Below, an example of the electrode connector assembly 130 of the present disclosure will be described in detail.

Figure 2:
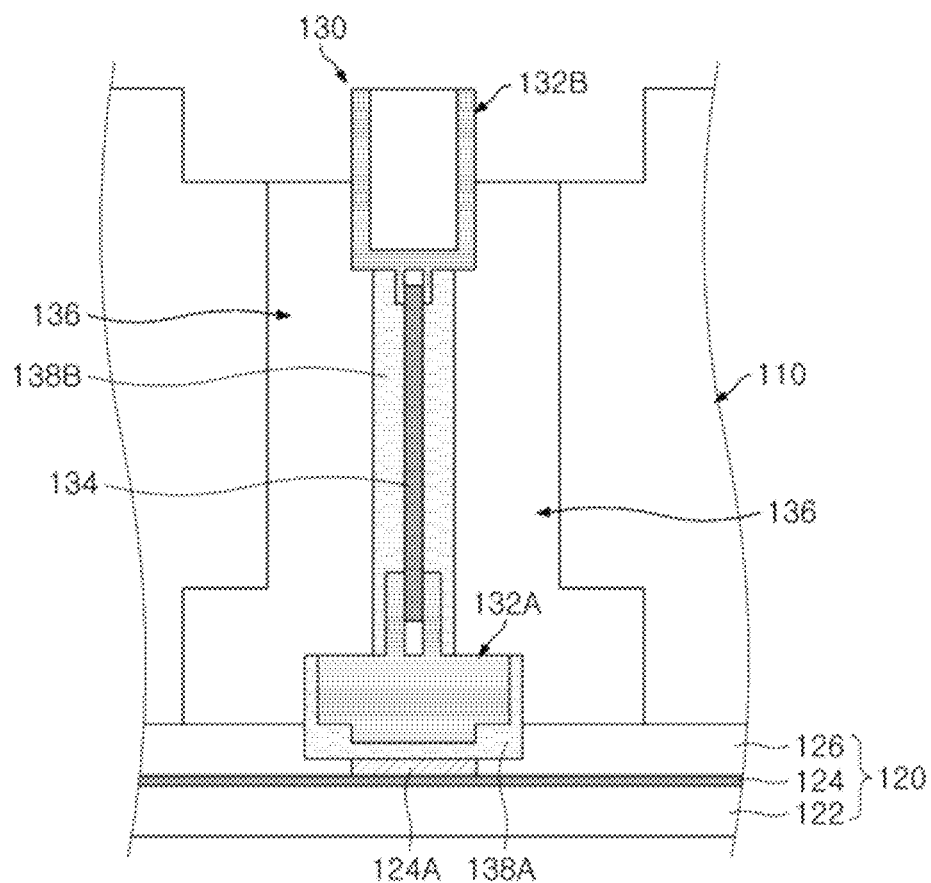
FIG. 2 is a cross-sectional view of a susceptor including an electrode connector assembly according to an embodiment of the present disclosure.

FIG. 2 illustrates an exemplary electric connection mechanism of the electrode connector assembly 130.

Referring to FIG. 2, the electrode connector assembly 130 penetrates the base member 110 and is electrically connected to the electrode 124 of the ceramic plate 120.

As illustrated, in the mounting site of electrode connector assembly 130, the insulating layer 126 is partially removed, and the electrode 124 is exposed. The electrode 124 is illustrated as including an electrode pad 124A to assist electric connection with the connector assembly, but the present disclosure is not limited thereto.

The well-shaped exposed portion of the plate is filled with an elastic bonding material 138A. In the electrode connector assembly 130, the front connector terminal 132A, which is a contact end with the electrode, is electrically connected to the electrode pad 124A via the elastic bonding material 138A.

Preferably, in the present disclosure, the elastic bonding material 138A includes a conductive elastomer (elastic body).

In the present disclosure, as the elastomer, at least one polymer selected from the group consisting of silicone rubber, butadiene, a copolymer of styrene and acrylonitrile, butyl rubber, and fluorine rubber is used. For example, silicone rubber containing a phenyl group in a side chain is suitable for use at a cryogenic temperature.

In the present disclosure, the conductive elastomer may contain conductive powder dispersed in an elastomer matrix. Metal powder or carbon powder may be used as the conductive powder. For example, the conductive elastomer may be silicone rubber in which carbon powder is dispersed. In the present disclosure, preferably, the conductive elastomer has high electrical conductivity at room temperature and low temperature. For example, the conductivity of the conductive elastomer is preferably in the range of 30 to 100 S/m at room temperature.

The above-described elastomer is flexibly elastically deformable in response to a change in pressure applied between the front connector terminal 132A and the electrode pad 124A. Thus, stable electric connection can be provided despite a change in temperature.

Meanwhile, the electrode connector assembly 130 may be provided with a rear connector terminal 132B, which is a power inlet end, and the front connector terminal and the rear connector terminal are electrically connected to each other by a connector rod 134. As illustrated, the connection between the connector terminal and the connector rod can be made by pressing the connector rod into a coupling groove provided in the connector terminal.

In the present disclosure, the connector rod may preferably be made of at least one metal selected from the group consisting of Cu, Ag, Au, Al, and Be. In addition, although the connector rod 134 is illustrated in a straight shape in the drawing, the present disclosure is not limited thereto, and the connector rod 134 may be curved or wound. In addition, the connector rod 134 may be fabricated by twisting or weaving several of metal wires. This structure may provide flexibility to the connector rod and suppress the connector rod from being broken.

The above-described terminal-flexible rod-terminal structure of the electrode connector assembly 130 makes it possible to buffer the difference in deformation due to the difference in thermal expansion rate between various materials of the plate and the connector.

In another aspect of the present disclosure, the electrode connector assembly 130 may have an insulating elastomer filled between the front connector terminal and the rear connector terminal. The filled elastomer may prevent condensation inside the connector at a low or cryogenic temperature and relieve thermal contraction stress.

As the insulating elastomer, at least one polymer selected from the group consisting of silicone rubber, butadiene, a copolymer of styrene and acrylonitrile, butyl rubber, and fluorine rubber is used. Preferably, the elastomer has a high elongation of 200% or more. Silicone rubber may be used as the elastomer.

In the present disclosure, one selected from the group consisting of Ti, Ni, Co, W, and Mo or an alloy of these metals may be used for the above-described connector terminals. Preferably, a metal having a thermal expansion coefficient similar to that of the material of the plate is used for the connector terminals. For example, when the plate is made of alumina (which has a thermal expansion coefficient of 6.5 ppm/° C. at room temperature), Ti (which has a thermal expansion coefficient of 8.5 to 9.0 ppm/° C. at room temperature) is preferably used.

Meanwhile, in the present disclosure, the electrode connector assembly 130 is provided with an insulating pipe 136 extending in the longitudinal direction of the connector to electrically insulate the connector terminal and the connector rod from the base member 110. In the present disclosure, the insulating pipe 136 may be made of a material selected from the group consisting of ceramic, glass, engineering plastic, and silicon dioxide. The most preferred insulating tube is ceramic, which can maintain its shape without thermal deformation at a low temperature.

In the present disclosure, the contact end of the front connector terminal 132A that is in contact with the electrode pad 124A may be provided with irregularities. Although FIG. 2 illustrates that one protrusion is provided at the contact end, the protrusion may be implemented with a plurality of bumps in the present disclosure.

MODE FOR CARRYING OUT THE INVENTION

In the present disclosure, the protruding structure of the front connector may be implemented in various ways. An example of a front connector terminal according to the present disclosure will be described with reference to FIG. 3.

Figure 3A:
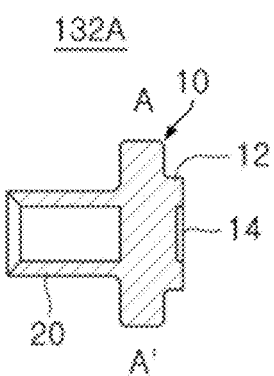
FIGS. 3A and 3B are a cross-sectional view and a front view, respectively, of a front connector terminal according to an embodiment of the present disclosure.
Figure 3B:
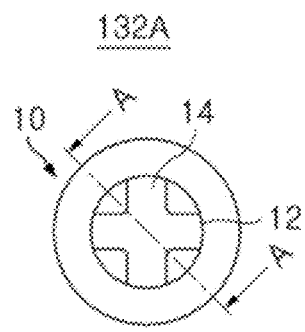

FIGS. 3A and 3B are a cross-sectional view and a front view, respectively, of a front connector terminal according to an embodiment of the present disclosure.

Referring to FIG. 3, the contact end 10 of the front connector terminal 132A includes a protrusion 12. As illustrated, the protrusion 12 is provided in the central portion of the contact end 10, and the peripheral portion has a relatively low step structure.

In addition, the other end of the connector terminal includes a connection portion 20 connected to the connector rod. A caulking-type connection structure may be used as the connection structure of the connection portion 20.

Meanwhile, in the present disclosure, the protrusion 12 includes an engraved pattern 14. Although an engraved pattern in the form of a cross pattern is illustrated in the drawing, various forms of engraved patterns such as a straight-line pattern and a grid pattern are possible.

In the present disclosure, since the elastomer is used as a bonding material, there is no chemical reaction between the elastomer and the connector terminal, which is a metal member, and therefore the bonding force is relatively weak. The protrusion and/or the engraved pattern may supplement bond strength to the flexible elastomer through mechanical engagement. In addition, the protrusion and the engraved pattern provided on the connector terminal are able to increase the contact area with the elastomer and reduce contact resistance.

In the present disclosure, the step formed at the contact end of the connector terminal is preferably in the range of 0.1 to 0.3 mm. In addition, the depth of the engraved pattern within the protrusion is preferably in the range of 0.1 to 0.3 mm. This is the appropriate range that enables uniform application without bubbles when filling the pattern with a conductive elastomer while increasing the contact area with the elastic polymer.

As described above, the present disclosure has been described based on specific details, such as specific components, limited embodiments, and drawings, but these are only provided to help a more general understanding of the present disclosure, and the present disclosure is not limited to the above-described embodiments. A person ordinarily skilled in the art to which the present disclosure pertains may make various modifications and changes without departing from the essential characteristics of the present disclosure. Therefore, the spirit of the present disclosure should not be limited to the described embodiments, and not only the appended claims, but also all technical ideas that are equivalent to or equivalently modified to the claims should be interpreted as being included in the scope of the present disclosure.

INDUSTRIAL APPLICABILITY

The present disclosure is applicable to a susceptor for supporting a wafer, such as an electrostatic chuck.

The invention claimed is:

1. A susceptor comprising:
a base member;
a ceramic plate comprising an electrode on the base member; and
an electrode connector assembly provided through the base member and configured to apply power to the electrode of the ceramic plate,
wherein the electrode connector assembly comprises:
a first connector terminal which is a contact end with the electrode;
a second connector terminal which is a power inlet end; and
a connector rod interconnecting the first connector terminal and the second connector terminal,
wherein the first connector terminal comprises a protrusion on a surface opposite to the electrode, and the protrusion comprises an engraved pattern, and
wherein the susceptor further comprises a conductive elastomer filled between the first connector terminal and the electrode, and the first connector terminal and the electrode are electrically connected to each other by the conductive elastomer.

2. The susceptor of claim 1, wherein the engraved pattern comprises a cross pattern, a straight line pattern, or a grid pattern.

3. The susceptor of claim 1, wherein the conductive elastomer contains conductive powder dispersed therein.

4. The susceptor of claim 3, wherein the conductive powder contains metal powder or carbon powder.

5. The susceptor of claim 1, wherein the electrode connector assembly comprises an insulating tube surrounding the first connector terminal, the connector rod, and the second connector terminal.

6. The susceptor of claim 1, wherein an insulating elastomer is filled between the first connector terminal and the second connector terminal.

7. The susceptor of claim 1, wherein the connector rod comprises a soft metal.

8. The susceptor of claim 7, wherein the connector rod is made by twisting or weaving a plurality of metal wires.

9. The susceptor of claim 1, wherein the electrode further comprises an electrode pad, and
wherein the electrode connector assembly is electrically connected to the electrode pad of the electrode.

10. The susceptor of claim 1, wherein the conductive elastomer contains conductive powder dispersed in at least one polymer selected from a group consisting of silicone rubber, butadiene, a copolymer of styrene and acrylonitrile, butyl rubber, and fluorine rubber.

11. The susceptor of claim 1, wherein the first connector terminal is made of titanium or a titanium alloy.

12. The susceptor of claim 1, wherein the electrode is a chucking electrode or an RF electrode.

13. The susceptor of claim 1, wherein the connector rod is made by twisting or weaving a plurality of metal wires.

14. The susceptor of claim 1, wherein the electrode further comprises an electrode pad, and
wherein the electrode connector assembly is electrically connected to an electrode pad of the electrode.

* * * * *